United States Patent [19]

Frobenius

[11] 3,821,092

[45] June 28, 1974

[54] CHARGE STORAGE TARGET AND METHOD OF MANUFACTURE

[75] Inventor: Wolf D. Frobenius, Murrysville, Pa.

[73] Assignee: Westinghouse Electric Corporation, Pittsburgh, Pa.

[22] Filed: Oct. 11, 1972

[21] Appl. No.: 296,718

[52] U.S. Cl......................... 204/15, 313/66, 317/235

[51] Int. Cl....... C23b 5/48, H01j 31/26, H01l 15/00

[58] Field of Search.......................... 204/15; 313/66; 317/235 NA; 96/36.2

[56] References Cited

UNITED STATES PATENTS

| | | | |
|---|---|---|---|
| 3,419,746 | 12/1968 | Crowell et al. | 313/66 |
| 3,517,246 | 6/1970 | Chester et al. | 313/66 |
| 3,564,309 | 2/1971 | Hoeberechts | 317/235 R |
| 3,569,758 | 3/1971 | Horiuchi | 317/235 R |
| 3,707,657 | 12/1972 | Veith | 317/235 NA |

OTHER PUBLICATIONS

Proceedings of the Second Kodak Seminar on Microminiaturization, April 4 & 5 (1966), pp. 36–43.

Data Release–Industrial Intelligence about Kodak Resists, pp. 8–10, Eastman Kodak Co., Rochester, N.Y., 14650.

Data Release–Kodak Autopositive Resist Type 3, Kodak Phamphlet No. P–194, (1969), Eastman Kodak Co.

*Primary Examiner*—T. M. Tufariello
*Attorney, Agent, or Firm*—W. G. Sutcliff

[57] ABSTRACT

A charge storage device of the type in which a target electrode provides a plurality of spatially distributed charge storage sites formed on an output side of semiconductor wafer with means associated with the storage sites for sensing and converting the charge on the storage sites into an electrical signal. Input excitation is directed onto the other or input side of the semiconductor wafer and may be in the form of electrons or light capable of generating electron-hole pairs within the semiconductor wafer which diffuse through to the storage sites. The output side of the semiconductor wafer is provided with an apertures insulating layer with a reading electron beam making contact through the apertures in the insulating coating to the spatially distributed storage sites within these apertures. This invention is directed to an improvement in the structure and the process for manufacture thereof wherein pillars of the semiconductive wafer extend from the substrate of the wafer above the insulating layer and a semiconductive region of opposite type conductivity to that of the wafer is provided in the top of the pillar and an electrical conductive contact is provided on the top of said pillar for better electron beam contact to the target. The invention is directed to this structure and the process of fabricating the electrical contact onto the top of the pillar. The process includes the spinning of a resist coating over the pillared surface of the target in such a manner to provide a desired resist pattern for the manufacturing process and thereby avoids other difficult masking process steps.

9 Claims, 28 Drawing Figures

OXIDATION

NITRIDE ETCH

DIFFUSION

EVAPORATE Ti/Au PILOT PLATING LAYER

SPIN PHOTO RESIST ONTO PILOT LAYER

PLATE UP METAL

OXIDE ETCH

DEEP Si ETCH

OXIDE ETCH

OXIDATION

BEFORE OXIDE ETCH

AFTER OXIDE ETCH

DIFFUSE, ETCH $SiO_2$, THIN, AND ADD N+

EVAPORATE Ti/Au PILOT PLATING LAYER

SPIN PHOTO RESIST ONTO PILOT LAYER

PLATE UP METAL

CHARGE STORAGE TARGET AND METHOD OF MANUFACTURE

BACKGROUND OF THE INVENTION

This invention is generally directed to a charge storage target and the process of manufacture for utilization within a pick-up camera tube. The specific application is a target that utilizes a semiconductor wafer of a first type of conductivity with a mosaic of regions of an opposite type conductivity to the wafer provided on one surface of the wafer and forming junctions with the wafer. The mosaic of junctions forms storage sites and they are scanned by a reading electron beam. Input radiation in the form of electrons or light is directed into the wafer from the opposite side with respect to the reading electron beam and generates electron-hole pairs which diffuse to the junctions formed in the wafer. The junctions are separated from each other and the regions form rectifying junctions with the semiconductor wafer or substrate. The junctions are provided with a reverse bias and the minority carrier is discharged through this reverse bias. The amount of electron beam current utilized by the reading beam in depositing a charge on the storage site to recharge the diode is the output signal. One type of storage target is described in U.S. Pat. No. 3,011,089 issued to F. W. Reynolds on Nov. 28, 1961 and U.S. Pat. No. 3,403,284 by T. M. Buck et al. issued Sept. 24, 1968. The targets described therein are generally referred to as a diode array target. A further extension of the light input type target is the use of a structure in which the input light image is first focused onto a photocathode and the emitted photoelectrons from a photocathode are in turn accelerated by an electric field and focused onto the input or front surface of the target. The carriers generated by the photoelectrons have the same function as the photo-generated carriers described above.

To allow the scanning reading electron beam to land on the individual diode regions positioned in the apertures of an insulating coating without being deflected by charge which tends to build up on the surrounding insulating layer, two main approaches have been utilized by the industry. The first is to cover the entire read side of the target with a resistive layer which allows this charge to leak off of the insulating coating to the diodes. A second approach is to cover most of the insulating coating with a conductive contact pad which extends out from each diode region and is separated by very narrow regions and thereby only a small region of the insulating coating is exposed to the reading beam. These types of targets are more generally discussed in copending U.S. patent application Ser. No. 241,045 entitled "Charge Storage Target and Method of Manufacture" by D. K. Schroder et al. and assigned to the same assignee as this invention.

The performance of the diode array target depends greatly on how easily the reading electron beam electrons can land or be accepted on these conductive contact pads. The mesa structure described in the above copending application has proven to be superior over the planar resistive sea type of design. The mesa structure provides projections of pillars extending from the semiconductor substrate and which support the contact pads some distance from the insulating coating. This so-called beam acceptance is influenced decisively by the amount of electrons which accumulate on the insulating layer between the diodes which in turn may set up an electrostatic screen which in turn repels the reading beam electrons. The conducting pads on the mesa type target may be of a doped epitaxial silicon or of a suitable metallic material. The epitaxial silicon type structure works well but is rather expensive as far as equipment and manufacturing process. It is also found that the epitaxial silicon does not accept the reading beam as well as a metallic contact. When a metallic contact is used in present art instead of the epitaxial contact, the sequence of fabrication must be altered such that the diffusion of the region into the pillars must be carried out before the pillars or the mesa type configuration is deep etched and passivated. It is found that the dark current may be higher than desired with diffusion prior to etch than when the pillars are etched and oxidized prior to the diffusion of the region. Another disadvantage of the present metallic contact structures is that they cannot be raised as much above the insulating surface as the epitaxial pads and therefore their screening effect is not as great It would therefore be desirable to fabricate the diodes following the fabrication process of a mesa structure of maximum cross section and height and then provide the metal contact onto the top of the pillars. This would produce diode to electron beam contact high enough above the insulating surface to screen effectively with maximum beam acceptance.

SUMMARY OF THE INVENTION

This invention is directed to a charge storage target and the process of manufacture in which the target includes a semiconductor wafer having pillars extending from one surface of the wafer substrate and wherein a region is provided within the upper portion of each of the pillars to form junctions with the remaining portion of the semiconductor wafer. The improved process provides a target utilizing an electrical conductive contact provided on the top of each pillar of greater dimensions than the cross section of the pillar to thereby screen the coating of insulating material on the surface of the wafer within the moat or recessed surface of the wafer surrounding the pillars. The improved process further provides a process wherein a semiconductor oxide etching mask is utilized in forming the pillars by deep etching the semiconductive wafer and other resist masking is provided for process steps including etching and electrodeposition wherein the resist coating is applied by applying a suitable resist material solution to the mesa surface of the target and then spinning the target to distribute the resist coating so that it substantially covers the moat surfaces, the sides of the pillars and the tops of the pillars but provides a peripheral exposed region about each pillar in the upper portion. This resist may be used as an etch or electroplating mask. The exposed region is provided on each pillar and includes the peripheral region of the top and the side regions immediately adjacent the exposed portion of the top.

BRIEF DESCRIPTION OF THE DRAWINGS

For a better understanding of the invention, reference may be had to the preferred embodiments, exemplary of the invention shown in the accompanying drawings, in which.

DESCRIPTION OF THE PREFERRED EMBODIMENTS

Figure 1:
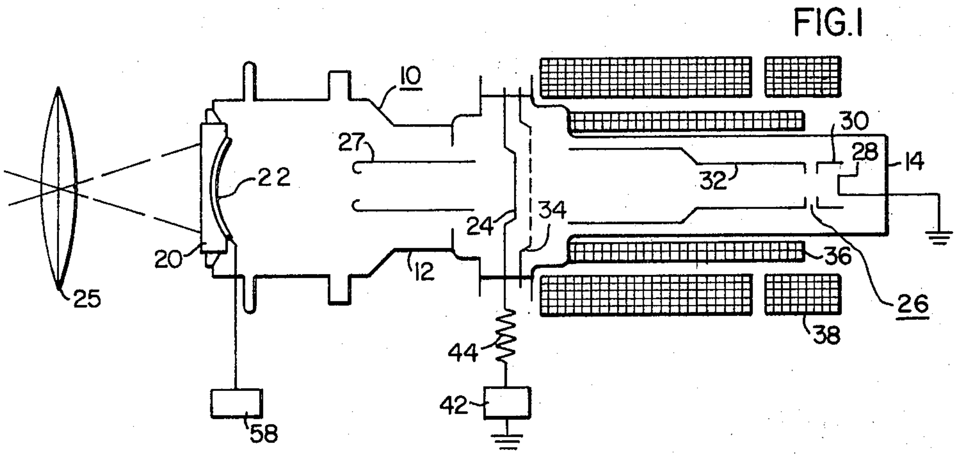
FIG. 1 is a schematic illustration of a pick-up tube incorporating a target in accordance with the teachings of this invention.

In FIG. 1, there is illustrated a pick-up tube comprising an evacuated envelope 10 including a tubular body portion 12 having a button stem 14, provided at one end thereof for closing off that end of the tubular portion 12. The button stem 14 also includes a plurality of lead-ins (not shown) for applying potentials to the electrodes within the envelope 10. The other end of the tubular body member 12 is closed off by a faceplate 20. The faceplate 20 is of a suitable material transmissive to the input radiation from the scene to be viewed. A suitable material for the faceplate 20 is glass or quartz. The faceplate 20 may be of a fiber optic type construction. A photocathode 22 is provided on the inner surface of the faceplate 20. The photocathode 22 may be of a suitable material responsive to the input radiation such as a multi-alkali photocathode material. The photocathode 22 will absorb the input radiations directed and focused thereon by a suitable lens 25. A target 24 is provided between the photocathode 22 and the reading electron gun 26. Photoelectrons emitted by the photocathode 22 are focused by suitable means such as an electrode 27 onto the target 24. Suitable structure for imaging the photoelectrons onto the target are well known and are described in volumes 1 and 2 of Photoelectronic Imaging Devices, Plenum & Press, New York-London, 1971.

The reading electron gun 26 is provided at the opposite end of the envelope 10 with respect to the target 24 and generates a pencil-like electron beam for scanning a raster over the target 24. The electron gun 26 is comprised of a cathode 28 which may be at ground potential. A control grid 30 and a focusing electrode 32 may also be provided in the electron gun 26. A grid 34 may be provided adjacent to target 24 and may be at a potential of about 500 volts positive with respect to ground. The electron gun 26 may be focused by either electrostatic or electromagnetic means. An electromagnetic focusing coil 36 is provided about the outer portion of the tubular member 12. The deflection means may also be electrostatic or electromagnetic, and in this specific device is shown as electromagnetic coil 38 for deflection of the electron beam to scan a raster over the target 24. The photocathode 22 may be connected to a high potential source 58 of about 10,000 volts negative with respect to ground. The target member 24 is provided with a suitable potential of about 10 volts positive with respect to ground by means of a potential source 42. A resistor 44 is also provided between the voltage source 42 and the target 24 for deriving the output signal from the device.

Figure 2:
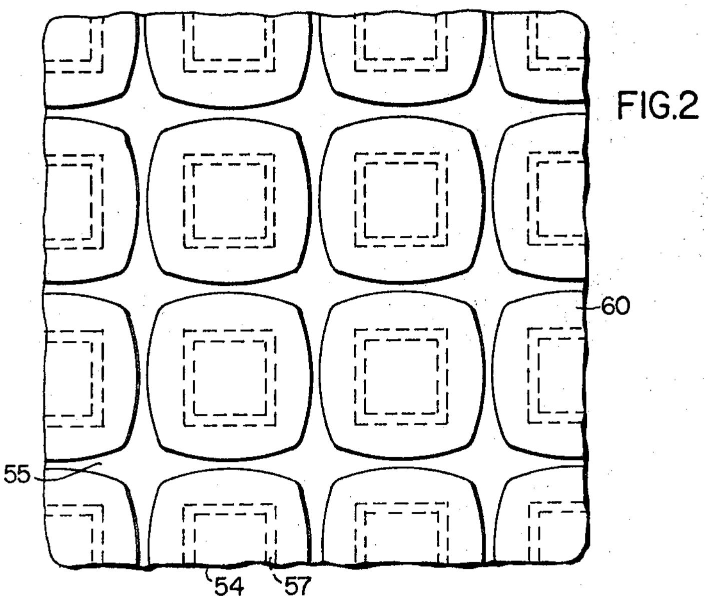
FIG. 2 is a plan view of a fragment of the scan or output surface of the target electrode of FIG. 1.
Figure 3:
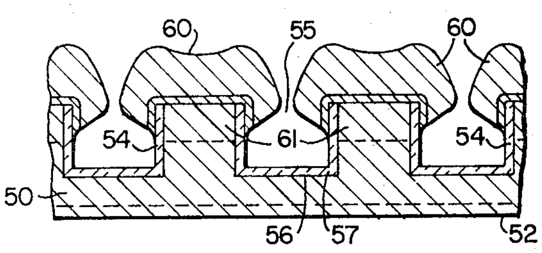
FIG. 3 is a sectional view of a portion of the target illustrated in FIGS. 1 and 2.

The target 24 is a diode target array and is shown in more detail in FIGS. 2 and 3. The target 24 is comprised of a body or substrate 50 which may be of a suitable semiconductive material such as silicon, germanium, or indium arsenide. In the specific device illustrated in FIG. 2 and 3, the substrate 50 is of an n-type silicon material having a resistivity of about 10 ohm centimeters. The crystal orientation of a wafer may be of any suitable type such as [111], or [100], or [110]. The input side of the target 24, that is, the side facing the photocathode 22 is provided with an N+ layer 52. The N+ layer 52 serves not only as the electrical contact of the target 24, but also establishes a field to prevent holes from recombining at the input surface.

The opposite side of the body 50 remote to the photocathode 22 is referred to as the read or output side of the target 24. The output side of the target 24 shown in FIG. 2 is provided with a plurality of pillars 54 extending from the substrate 50. The pillars 54 extend for a distance of about 3 to 5 microns above the upper surface of the body 50. The pillar 54 has a rectangular cross section and is about 4 microns on a side. The pillars 54 are formed from the wafer by etching out the surrounding portions of the wafer to provide a moat portion 55 about the pillars 54. The distance from the bottom surface 56 of the moat 55 and the opposite or the input surface of the wafer is about 10 microns. The recessed surface 56 as well as the side walls of the pillars 54 are provided with a coating 57 of a suitable insulating material such as silicon dioxide. The thickness of the coating 57 may be about 0.5 to about 1 micron. A conductive contact or pad 60 is provided on the top of each of the pillars 54 and the conductive contacts 60 cover not only the top surface of the pillar 54 but extend out over the insulating coating 57 provided on the side walls of the pillar 54 and the recess surface 56 so as to provide a gap of about 2 microns between the adjacent conductive contacts 60. The conductive contacts 60 may be of a suitable electrical conductive material such as gold.

Figure 5:
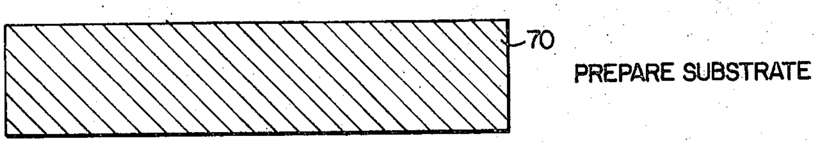
FIGS. 5–18 illustrate steps in the manufacture of the target shown in FIG. 3; and, FIGS. 19–28 illustrate steps in the manufacture of the targets illustrated in FIG. 4.
Figure 6:
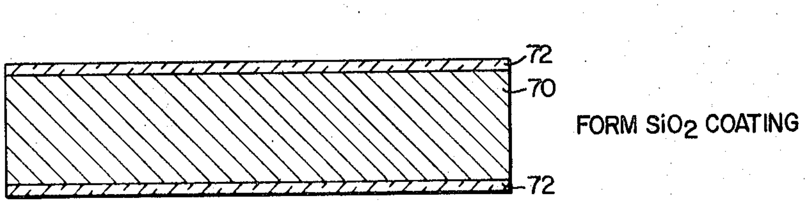
Figure 7:
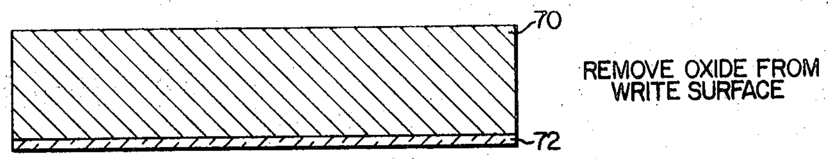
Figure 8:
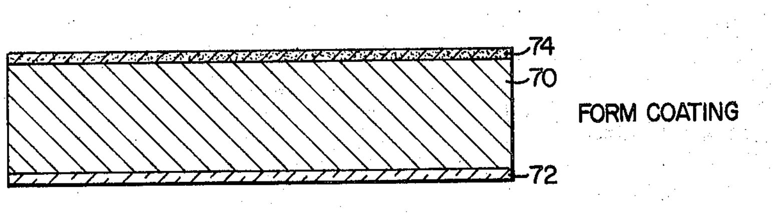
Figure 9:
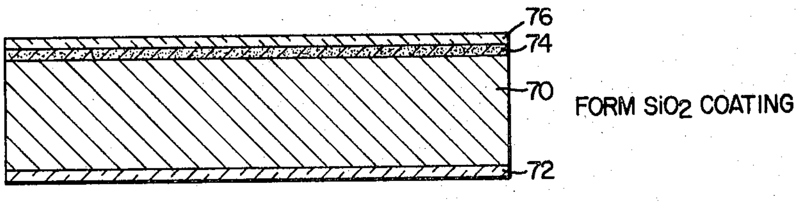
Figure 10:
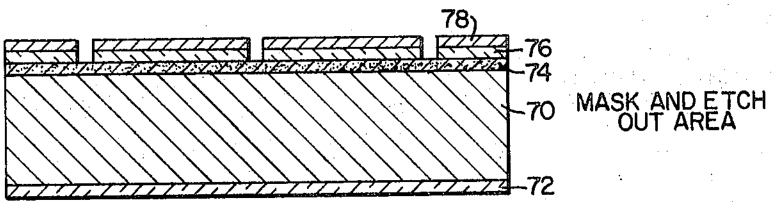
Figure 11:
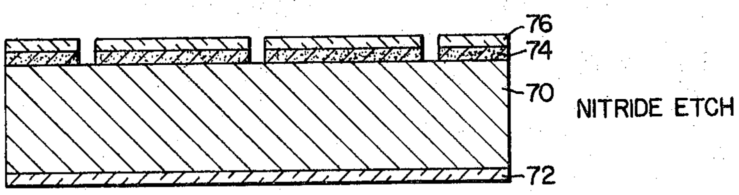

In the fabrication of the target set forth in FIGS. 2 and 3, a wafer 70 as shown in FIG. 5 of a suitable n-type silicon is obtained having a resistivity of about 10 ohm centimeters and with a diameter of about 1.25 inches and a thickness of about 0.008 inch. For the silicon deep etch technique, the (111) orientation may be used, however the (100), and to a lesser extent, the (110) orientation may be used with preferential silicon etches that etch deeper vertically but negligibly in the lateral direction. This permits very deep moats to be formed about the pillars 54. The first step in the fabrication is to provide an insulating coating 72 such as a silicon dioxide coating on the upper and lower surfaces as shown in FIG. 6. The thickness of the coatings 72 are about 10,000 angstroms. The oxide coating 72 may be provided by thermal oxidation at about 1100°C for three hours in the atmosphere of wet oxygen. The next step in the process is as shown in FIG. 7 to remove the oxide coating 72 from the upper surface of the wafer 70. The upper surface of the wafer 70 corresponds to the read side of the target. A suitable etch for the removal of the silicon dioxide coating 72 is buffered hydrofluoric acid which is comprised of 6 parts ammonium fluoride to 1 part of hydrofluoric acid. The lower surface may be protected by a glass slide secured by dental wax. The next step in the process is to form a suitable etch mask on the upper or output surface of the wafer 70. This may be accomplished by first growing a coating 74 of about 1,000 angstroms thick of silicon nitride ($Si_3N_4$) on the output side of the wafer 70. The coating 74 may be provided by chemical vapor deposition. This step is shown in FIG. 8. Next, a coating 76 of silicon dioxide of a thickness of about 2,000 angstroms is provided over the silicon nitride coating 74. The coating 76 may be provided by chemical vapor deposition onto the coating 74. This step is illustrated in FIG. 9. Next a coating of photoresist 78 is provided on top of the layer 76. A suitable resist is a negative reacting resist. The photoresist layer is then exposed by suitable radiation through a mask such as a mesh by well known techniques so that the areas exposed to light become rectangular or square dots or islands less soluble and the portion of the coating which is more soluble can be removed by washing to leave a mosaic pattern of photoresist on the silicon dioxide layer 76. This pattern is generally illustrated by the array of pillars 54 shown in FIG. 2. A suitable etch is then utilized to etch away the exposed portion of the silicon dioxide layer 76 through the photoresist layer 78. This may be accomplished with a buffered hydrofluoric acid. This is illustrated in FIG. 10. The remaining insoluble portion of the photoresist layer 78 may be removed with a suitable resist remover such as microstrip, a commercial preparation by Hunt Chemical Co. The silicon nitride layer 74 is then subjected to a suitable etch such as hot photphoric acid at about 185° for about 25 minutes which removes the exposed portion of the silicon nitride layer 74 through the silicon dioxide layer 76. The resulting structure is illustrated in FIG. 11 and provides a suitable etch mask for the silicon wafer 70.

Figure 12:
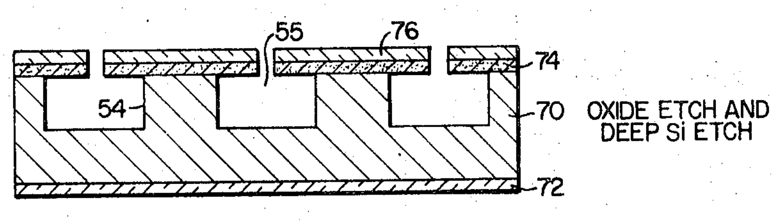
Figure 13:
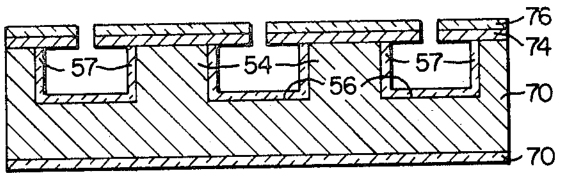
Figure 14:
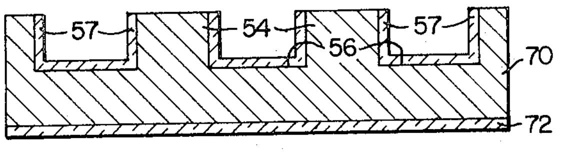
Figure 15:
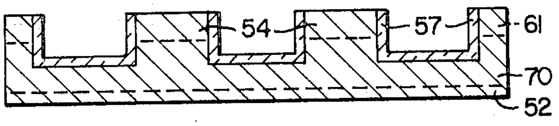

The next step in the operation is to etch the silicon wafer 70 through the etch mask comprised of the mosaic pattern of layers 74 and 76. A suitable etch solution is one of about 25 parts of $HNO_3$, 10 parts of acetic acid and 3 parts of hydrofluoric acid. This etching operation takes about 90 seconds and etches downward and also slightly beneath the etch pattern mask to remove the moat portion 55 and leave the pillar 54. In this operation, the wafer 70 is etched to a depth of about 4 microns and the distance between pillars 54 is about 5 microns. This structure is illustrated in FIG. 12. The next step in the fabrication is to oxidize the wafer 70 to provide the coating 57 which has a thickness of about 10,000 angstroms. This may be accomplished by thermal oxidation at 1100°C for three hours in wet oxygen. The coating 57 covers the recessed surface 56 and the sides of the pillar 54 as shown in FIG. 13. The next step in the operation is to etch away the silicon dioxide layers 76 formed on the silicon nitride 74 and this may be accomplished by utilizing buffered hydrofluoric acid. This etch will reduce the thickness of the layer 57. After the silicon dioxide layer 76 has been removed from the silicon nitride layer 74, the silicon nitride layer 74 is removed by etching with hot phosphoric acid at about 185° for about 30 minutes. The resulting structure is shown in FIG. 14. The corner formed between the top surface and side of the pillars 54 has a radius of curvature of about 1,000 angstroms. The radius of curvature should not be greater than 1 micron in order to enable the use of resist coatings without requiring patterns or exposures as normally required. The next step in the operation is to provide a diffusion coating on the top of the pillars 54 of a suitable material such as boron and then diffuse this into the pillars to form the region 61. The next step is to etch off the oxide layer 72 from the input surface of the wafer 70 by use of a suitable etch such as buffered hydrofluoric acid. The wafer is then thinned to the desired thickness. If one desires an outer thicker peripheral support rim for the wafer, then masking may be provided on the outer periphery with a suitable masking material such as evaporated chrome and gold or wax. The thinning step etches away portions of the input side of the wafer 70 so as to provide a thickness between the recess surface 56 and the input surface of about 10 microns. A suitable etch is a solution of 25 parts of $HNO_3$, 10 parts of acetic acid and 6 parts of hydrofluoric acid for about 70 minutes. The next step is to diffuse the layer 52 into the input surface, and this may be accomplished by providing a $POCl_3$ ambient for about 45 minutes at 900°C which results in a phosphorus diffusion into the surface. This provides the input layer 52 having a concentration of phosphorus atoms of about $1 \pm 10^{20}$ phosphorus atoms per $cm^3$ of silicon. It may be necessary to provide a slight oxide etch to remove any oxide from on top of pillar 54. The next operation is to hydrogen anneal the wafer at 400° for about 60 minutes. The resulting structure is shown in FIG. 15. The target may now be operated in a demountable test set for quality control selection purposes. The raised pillar structure enhances the usefulness of this pre-contact inspection step by means of improved beam acceptance. The performance of the target after metal contacts are applied is, however, far superior to the target performance at this stage.

Figure 16:
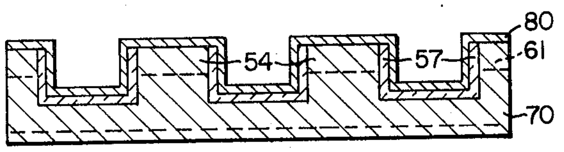
Figure 17:
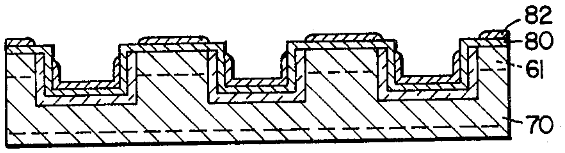
Figure 18:
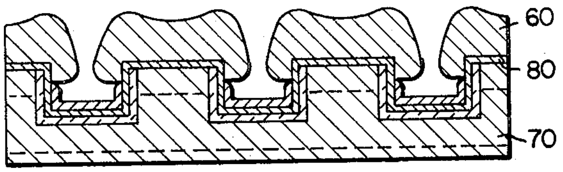

The next fabrication technique is to provide the electrical contact pad 60 on the top of the pillar 54. This may be accomplished by evaporating a pilot layer coating 80 of a suitable material such as a sequential evaporation of titanium and gold to provide a layer of about 100 angstroms of Ti and then 300 angstroms of Au in thickness for a subsequent electroplating operation. This configuration is shown in FIG. 16. A resist coating 82 is then deposited over selected areas of the coating 80. This may be accomplished by utilizing a suitable resist material such as a photoresist AZ 111 supplied by Shipley Co., Newton, Massachusetts having a viscosity of about 36 centipoises. A quantity of this material, about 1 cc, is placed on the coating 80 which fills the moats 55 and then the target is spun at about 3,500 rpm horizontally about a vertical axis. This spinning operation is done in about ½ minute's time and then this layer is pre-baked, developed and post-baked, but not exposed to light. No masking, or exposure operation is required. The resulting coating 82 covers the surface 56 and the sides of the pillar 54 substantially to the top. It also covers substantially the central portion of the upper surface of the pillar 54. It can be seen, however, that the region about the outer edge of the pillar 54 is substantially free of the resist material, as is the upper portion of the sides of the pillar 54. This is shown in FIG. 17. The thickness of the resist coating is about 0.3 to 1 microns. The height of pillars 54 must be at least 1 micron and must be significantly higher than resist coating, about 3 to 1. The next step in the operation is to electroplate a suitable electrically conductive material onto the target. This may be accomplished by immersing the target in a gold-plating solution, of which the commercially available PUR-A-GOLD by Sel-Rex Company is an example. An electrical connection is made to the pilot layer 80 and held at a negative potential. An electrode of opposite or positive polarity is positioned approximately 2 inches away from and parallel to the pillared surface of the target. This positively biased electrode is conveniently composed of platinum. To stabilize the current flow, it is useful to insert a resistor of typically 100 ohms in series with the target. The plating bath is maintained at 55°C and is vigorously stirred. The negative potential to the pilot layer 80 is increased until a current density of about 1.2 mA/sq. in. is reached and then held at this current density. It is an advantage of this process that this plating current density is non-critical. A plated thickness or height of about 4 microns is accomplished in about 60 minutes. The resulting structure is shown in FIG. 18. The plate operation tends to plate under the resist coating and remove it from the top of the pillar.

After the plating step is completed, the target is removed from the bath. The resist layer 82 is stripped by immersion in acetone. The pilot layer 80 which now connects all diodes is etched away in the recess or moat area and the sides of the pillars 54, resulting in diode isolation on the output side of the target. The finished target is shown in FIG. 3.

Figure 4:
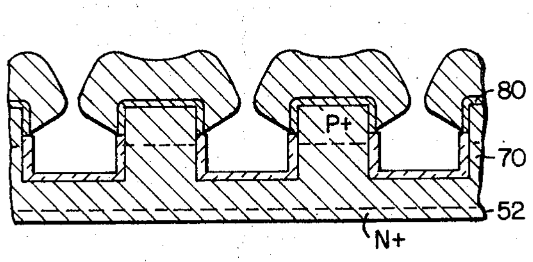
FIG. 4 is a sectional view of a portion of a modified target electrode that may be incorporated in FIG. 1 and in accordance with the teachings of this invention.
Figure 19:
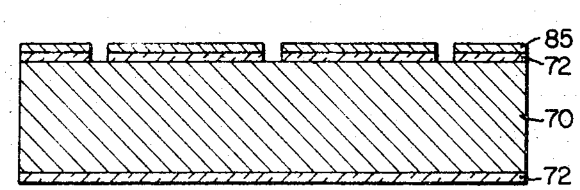
Figure 20:
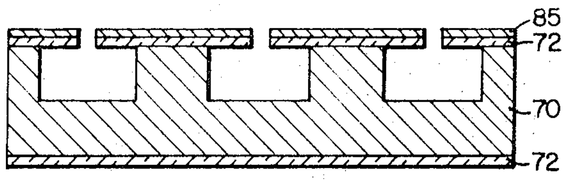
Figure 21:
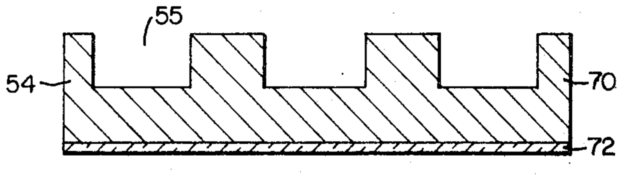
Figure 22:
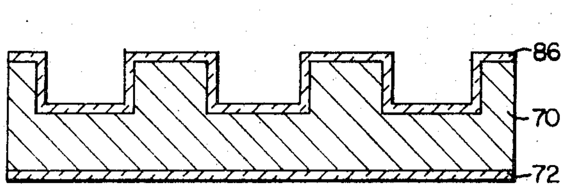
Figure 23:
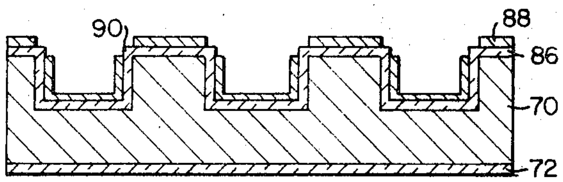
Figure 24:
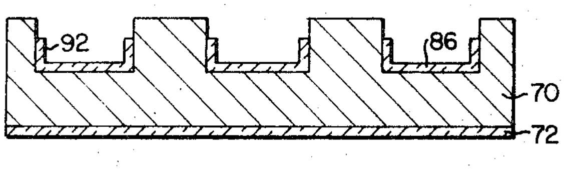
Figure 25:
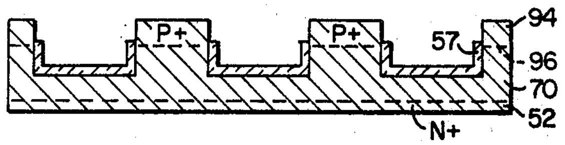
Figure 26:
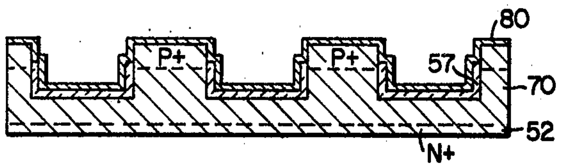
Figure 27:
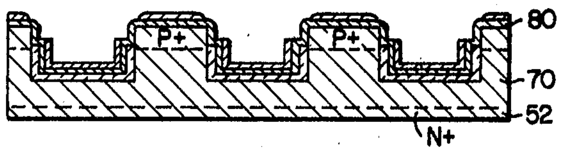
Figure 28:
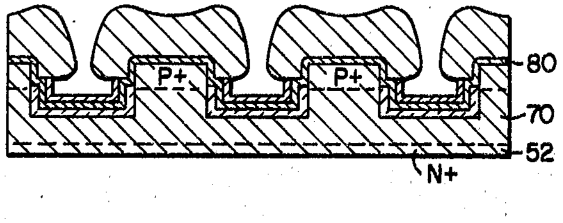

An alternate fabrication sequence which avoids the use of a $Si_3N_4$ etch mask may also be used. FIG. 4 illustrates another embodiment. The fabrication steps are illustrated in FIGS. 19–28; again as in the previous embodiment, a suitable wafer 70 similar to that described with respect to the previous embodiment is provided. The first step is to oxidize the wafer 70 to provide the coating 72 of a silicon dioxide of a thickness of about 10,000 angstroms. The next step is to provide a photoresist coating 85. A suitable resist is a negative acting resist. Photoresist layer 85 is then exposed by suitable radiation through a mask by well known techniques so that the areas exposed to light become less soluble and the unexposed areas which are soluble can be removed by washing to leave a mosaic pattern of photoresist on the silicon dioxide layer 72. This pattern is only provided on the upper surface of the wafer 70 which is the output side of the target. The pattern is generally as illustrated by FIG. 2. A suitable etch is then utilized to etch away the exposed portion of the silicon dioxide layer 72 through the photoresist layer 85. This may be accomplished with buffered hydrofluoric acid which consists of six parts of ammonium fluoride to one part of hydrofluoric acid. The structure is shown in FIG. 19. The remaining portion of the photoresist layer 85 may be then removed with a suitable resist remover. The next step in the operation is to etch the silicon wafer 70 through the etch mask 72 provided by the silicon dioxide using a solution of 25 parts of $HNO_3$, 10 parts of acetic acid and 3 parts of hydrofluoric acid for about 90 seconds. This etching operation etches downward and also slightly beneath the etch pattern to form moat portions 55 around the pillars 54. The wafer 70 is etched to a depth of about 4 microns and the distance between the pillars 54 is about 8 microns. The pillars 54 are square in cross section with a side having a dimension of 5 microns. The result is shown in FIG. 20. The next step in the operation is to remove the mosaic of island 72 on the upper surface and this may be accomplished by a suitable oxide etch such as buffered hydrofluoric acid for about 12 minutes. This resulting structure is shown in FIG. 21. The next step in the operation is to provide a silicon dioxide layer 86 on the upper surface as illustrated in FIG. 22. This may be accomplished by thermal oxidation at about 1,100° for three hours in an atmosphere of wet hydrogen to provide a coating 86 of a thickness of about 10,000 angstroms. The next step in the operation is to provide a resist coating 88 as illustrated in FIG. 23 on the coating 86. This may be accomplished by utilizing a positive photoresist such as AZ 111, and this is spun onto the mesa side of the target, pre-baked, developed and post-baked but not exposed to light in order to provide an etch-resistant layer. The speed of rotation is about 3,500 rpm and for a period of about ½ minute. Due to the sharp edges of the pillars 54, the resist will not provide a continuous film, but exposes an open edge 90, as explained with respect to previous embodiment, which outlines accurately the top of the pillar 54. The next step in the operation is to etch the upper surface of the wafer with a suitable etchant such as buffered hydrofluoric acid for a period of 11 minutes. This etching operation attacks the silicon dioxide coating 86 and proceeds to further attack this coating beneath the resist coating so that both coatings break down. This undercutting progresses at the same rate on the horizontal as on the vertical side of the pillar 54. The consequence is that because of the geometry of the pillar 54, the top layer of silicon dioxide 86 will come off before the sides of the pillar 54 are completely stripped, leaving a small oxide rim 92 as illustrated in FIG. 24. The next step in the operation is to diffuse a P-type material into the pillar 54 to form the region 94 and a junction 96 within the pillar member. This may be accomplished by boron diffusion. It is also necessary to thin the wafer, form layer 52 and anneal at this time. This has been described with respect to previous embodiment. The next step in the operation is to evaporate a suitable electroplating pilot layer 80 as described with respect to FIG. 16, and this specific embodiment is shown in FIG. 26. A resist coating 82 is then positioned on the target as illustrated in FIG. 27 and described with respect to FIG. 17, and then a plating operation again described with respect to FIG. 18 and illustrated in FIG. 28 is performed. The resulting configuration has already been described with respect to FIG. 4. It may be desirable to evaporate an electrical conductive coating over the completed readout side of the target. This forms an electrical conductive grid at the bottom of the moats. This grid may be tied to a fixed potential, such as the N+ layer potential.

In the operation of the device of FIG. 1, radiation from a scene is directed through the lens 25 onto the photocathode 22. This radiation is absorbed by the photo-emissive cathode 22 and the photoelectrons are generated and accelerated into the target 24. The electron beam from the electron gun 26 initially established and periodically re-establishes a reverse bias on the PN junction formed within the target 24 between the contact 60 and the wafer 50. The electrons enter through the layer 52 into the N-type body or substrate region 50 and produce corresponding patterns of electron-hole pairs in response to electron bombardment. The holes diffuse to the junction of the diodes formed and partially discharge the reverse biased diodes. The electron beam from the electron gun 26 will recharge said diodes on the next scan and will produce an output pulse to the video output which is taken across the resistor 44. The operation is such that the electron gun 26 charges the contact 60 to cathode potential while the backplate formed by the layer 52 is at a positive potential of about 10 volts.

It is, of course, obvious that other modifications will readily occur to those skilled in the art.

I claim:

1. A method of fabricating a semiconductive charge storage target comprising the steps of: forming an etch mask comprised of a plurality of island members on one surface of a semiconductive wafer, treating said one surface of said wafers with an etchant through said etch mask to etch away a portion of said wafer and leave a mesa-like surface comprised of a plurality of pillar-like members extending from the substrate of said wafer and supporting said island members, oxidizing the etch surface of said mesa surface to passivate said surface, removing said etch mask from said wafer, forming a PN junction within each of said pillar-like members, evaporating an electrical conductive pilot coating over said mesa-like surface, depositing a resist solution on said mesa-like surface and rotating said target to distribute said resist material over said mesa-like surface to cover substantially the entire mesa-like surface other than an upper peripheral region of each of said pillar-like members and electroplating an electrical conductive contact onto each of said pillar-like members of dimensions greater than that of said pillar-like members so that said electrical conductive contact covers not only the top portion of said pillar-like members but extends outwardly over the recessed regions of said wafer, and thereafter etching away the photoresist and pilot conductive layer from atop the insulating layer between the mesa portions.

2. The method set forth in claim 1 in which the target is rotated at a speed of about 3,500 rpm per minute.

3. The method set forth in claim 1 in which said pillar-like members have a top surface meeting the sides of said pillar-like member with a radius of curvature of less than one micron.

4. The method set forth in claim 1 in which the thickness of said resist coating is less than one-third the height of said pillar-like members.

5. A method of fabricating a semiconductive charged storage target comprising the steps of: forming an etch mask comprised of a plurality of island members on one surface of a semiconductive wafer, treating said surface of said wafer with an etchant through said etch mask to etch away a portion of said wafer between and beneath a portion of said island members to provide a plurality of pillar-like extension members extending from the substrate of said wafer and each of said pillar-like members supporting an island member, removing said etch mask from said wafer, oxidizing the etch surface of said mesa type surface to passivate said surface, depositing a resist material on said mesa-like surface, rotating said target to distribute said resist material over said mesa-like surface to cover substantially the entire mesa-like surface other than an upper peripheral edge region on each of said pillar-like members, treating the resist-coated surface with an etch to which said oxide coating is more susceptible than said resist coating so as to remove the exposed oxide coating and also attack and remove the oxide coating from the top of said pillar-like member and at least a portion of the sides of said pillar-like member, forming a PN junction within each of said pillar-like members, depositing an electrical conductive pilot layer over said mesa type surface, depositing a resist solution over said electrical conductive pilot layer by spinning said target in a manner to provide a resist coating over the mesa-type surface other than an upper peripheral edge region on each of said pillar-like members and electroplating an electrical conductive contact onto the upper surface of each of said pillar-like members of a larger area than the cross-section of said pillars, and thereafter etching away the photoresist and pilot conductive layer from atop the insulating layer between the mesa portions.

6. The method set forth in claim 5 in which said etch mask is an oxide of the semiconductive material.

7. A mesa type diode array target comprising a semiconductive substrate, spaced apart diode junction mesa portions on one surface of the substrate, and an enlarged conductive metal contact cap disposed on the extending end of each diode junction mesa, which conductive metal contact cap covers the entire extending end portion of the diode junction mesa and also extends in a direction normal to the mesa projection and is closely spaced from adjacent contact caps, which contact cap is electrodeposited by the process in which an insulating layer is provided on the semiconductive surface between the mesa portions, and a thin conductive metal pilot layer is deposited atop the mesa portion side of the substrate said thin conductive metal pilot layer covering the mesa portion and the insulating layer between the mesa portions, selectively depositing a photoresist coating over portions of the thin conductive metal pilot layer with the peripheral edge of the mesa between the end wall and the side wall of the mesa is free of photoresist coating, to expose the pilot conductive coating thereat, and electrodepositing the enlarged conductive metal contact cap, and thereafter etching away the photoresist and pilot conductive layers from atop the insulating layer between the mesa portions.

8. The device specified in claim 7, wherein said selective deposition of photoresist coating is carried out by depositing the resist over the mesa portion side of the substrate and spinning the substrate about its vertical axis.

9. The device specified in claim 7, wherein the contact cap is gold.

* * * * *